US010734326B2

(12) United States Patent
Shen et al.

(10) Patent No.: US 10,734,326 B2
(45) Date of Patent: Aug. 4, 2020

(54) HERMETIC FLAT TOP INTEGRATED HEAT SPREADER (IHS)/ELECTROMAGNETIC INTERFERENCE (EMI) SHIELD PACKAGE AND METHOD OF MANUFACTURING THEREOF FOR REDUCING WARPAGE

(71) Applicant: DiDrew Technology (BVI) Limited, San Jose, CA (US)

(72) Inventors: Minghao Shen, San Jose, CA (US); Xiaotian Zhou, Fremont, CA (US); Xiaoming Du, Shanghai (CN); Chunbin Zhang, Fremont, CA (US)

(73) Assignee: DiDrew Technology (BVI) Limited, San Jose, CA (US)

( * ) Notice: Subject to any disclaimer, the term of this patent is extended or adjusted under 35 U.S.C. 154(b) by 0 days.

(21) Appl. No.: 15/957,831

(22) Filed: Apr. 19, 2018

(65) Prior Publication Data

US 2019/0252324 A1 Aug. 15, 2019

Related U.S. Application Data

(60) Provisional application No. 62/631,134, filed on Feb. 15, 2018.

(51) Int. Cl.
*H01L 23/552* (2006.01)
*H01L 23/31* (2006.01)
(Continued)

(52) U.S. Cl.
CPC ........ *H01L 23/552* (2013.01); *H01L 23/3114* (2013.01); *H01L 23/3128* (2013.01);
(Continued)

(58) Field of Classification Search
CPC ............. H01L 23/3114; H01L 23/3128; H01L 23/481; H01L 23/49816; H01L 23/49827; H01L 23/552
See application file for complete search history.

(56) References Cited

U.S. PATENT DOCUMENTS 5,379,942 A 1/1995 Kuhnert
5,436,745 A 7/1995 Voisin
(Continued)

OTHER PUBLICATIONS

Chip-On-Glass (COG) for LCD Modules, NXP.
(Continued)

*Primary Examiner* — Andrew Q Tran
(74) *Attorney, Agent, or Firm* — Scully Scott Murphy & Presser

(57) ABSTRACT

Disclosed is a semiconductor device and method of manufacturing a semiconductor device that includes planarizing surfaces of a semiconductor substrate and a carrier substrate and then placing the semiconductor substrate on the carrier substrate such that the planarized surfaces of each are adjoining and allowing the semiconductor substrate to bond to the carrier substrate using a Van der Waals force. The method also includes forming a metal filled trench around the semiconductor substrate and in contact with the carrier substrate, which can also be formed of metal. The metal filled trench and carrier substrate together form a metal cage-like structure around the semiconductor substrate that can serve as a heat sink, integrated heat spreader, and Electro-Magnetic Interference shield for the semiconductor substrate.

17 Claims, 3 Drawing Sheets

(51) Int. Cl.
*H01L 23/00* (2006.01)
*H01L 23/498* (2006.01)
*H01L 23/48* (2006.01)

(52) U.S. Cl.
CPC ...... *H01L 23/481* (2013.01); *H01L 23/49816* (2013.01); *H01L 23/49827* (2013.01); *H01L 24/16* (2013.01); *H01L 24/97* (2013.01)

(56) References Cited

U.S. PATENT DOCUMENTS

| | | | | |
|---|---|---|---|---|
| 5,705,855 | A | 1/1998 | Carson | |
| 5,822,030 | A | 10/1998 | Uchiyama | |
| 6,338,980 | B1 * | 1/2002 | Satoh | H01L 21/561 257/E21.508 |
| 6,373,545 | B1 | 4/2002 | Yang | |
| 6,456,353 | B1 | 9/2002 | Chen | |
| 6,534,338 | B1 | 3/2003 | Schoonejongen | |
| 6,590,292 | B1 * | 7/2003 | Barber | H01L 21/563 257/704 |
| 6,627,996 | B1 | 9/2003 | Yokoyama | |
| 6,885,032 | B2 | 4/2005 | Forbes | |
| 7,002,809 | B2 | 2/2006 | Lee | |
| 7,839,469 | B2 | 11/2010 | Wu | |
| 8,044,464 | B2 | 10/2011 | Yamazaki | |
| 8,048,358 | B2 | 11/2011 | Takano | |
| 8,513,124 | B1 | 8/2013 | Ponnuswamy | |
| 9,202,716 | B2 | 12/2015 | Park et al. | |
| 9,381,732 | B2 | 7/2016 | Lindner et al. | |
| 9,449,935 | B1 | 9/2016 | Shih et al. | |
| 9,502,323 | B2 | 11/2016 | Lin et al. | |
| 9,547,208 | B2 | 1/2017 | Grip | |
| 9,664,932 | B2 | 5/2017 | Nishino | |
| 9,679,785 | B2 | 6/2017 | Chinnusamy | |
| 9,766,518 | B2 | 9/2017 | Fujikawa | |
| 9,911,672 | B1 | 3/2018 | Wu et al. | |
| 2002/0142566 | A1 | 10/2002 | Ravi | |
| 2003/0137621 | A1 | 7/2003 | Zhang | |
| 2005/0029644 | A1 | 2/2005 | Ho | |
| 2006/0290011 | A1 | 12/2006 | Cobbley | |
| 2007/0117354 | A1 | 5/2007 | Gadkaree | |
| 2008/0111786 | A1 | 5/2008 | Goudarzi | |
| 2008/0142946 | A1 | 6/2008 | Yang | |
| 2008/0182363 | A1 | 7/2008 | Amrine | |
| 2008/0268618 | A1 | 10/2008 | Yamazaki | |
| 2009/0001504 | A1 | 1/2009 | Takei | |
| 2010/0072618 | A1 | 3/2010 | Camacho | |
| 2010/0203676 | A1 | 8/2010 | Theuss | |
| 2011/0127654 | A1 | 6/2011 | Weng | |
| 2011/0156235 | A1 * | 6/2011 | Yuan | H01L 23/16 257/690 |
| 2011/0221041 | A1 | 9/2011 | Lin | |
| 2011/0316156 | A1 | 12/2011 | Pagaila | |
| 2012/0000613 | A1 | 1/2012 | Thallner | |
| 2012/0217643 | A1 | 8/2012 | Pagaila | |
| 2013/0134445 | A1 | 5/2013 | Tarsa | |
| 2013/0147063 | A1 | 6/2013 | Park | |
| 2013/0277675 | A1 | 10/2013 | Yoshikawa | |
| 2014/0061893 | A1 | 3/2014 | Saeidi | |
| 2014/0175637 | A1 | 6/2014 | Stuber et al. | |
| 2014/0335658 | A1 | 11/2014 | Scanlan | |
| 2015/0055036 | A1 | 2/2015 | Weber et al. | |
| 2015/0325520 | A1 | 11/2015 | Yu | |
| 2016/0054612 | A1 | 2/2016 | Hao | |
| 2016/0099242 | A1 | 4/2016 | Mallikarjunaswamy | |
| 2016/0111035 | A1 | 4/2016 | Morita | |
| 2016/0203787 | A1 | 7/2016 | Park | |
| 2016/0238862 | A1 | 8/2016 | Nishino | |
| 2016/0276307 | A1 | 9/2016 | Lin | |
| 2016/0372426 | A1 | 12/2016 | Luan | |
| 2017/0018450 | A1 | 1/2017 | Tang | |
| 2017/0103904 | A1 | 4/2017 | Nguyen | |
| 2017/0200647 | A1 | 7/2017 | Stering | |
| 2018/0040489 | A1 | 2/2018 | Fehkuhrer | |
| 2018/0076142 | A1 | 3/2018 | Shim et al. | |
| 2018/0145059 | A1 | 5/2018 | Welch | |

OTHER PUBLICATIONS

Matope, S. et al. "Silver, Copper and Aluminium Coatings for Micro-Material Handling Operations", South African Journal of Industrial Engineering, Aug. 2013, vol. 24(2), pp. 69-77.
Solder from Wikipedia.

* cited by examiner

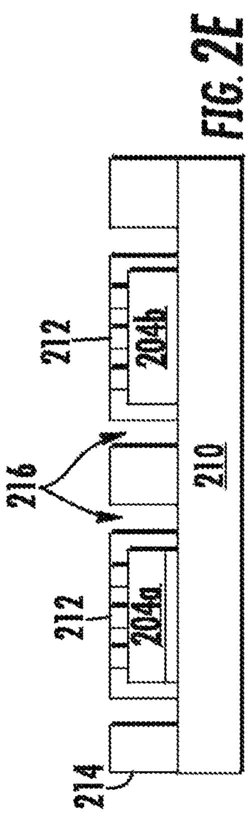
FIG. 2E
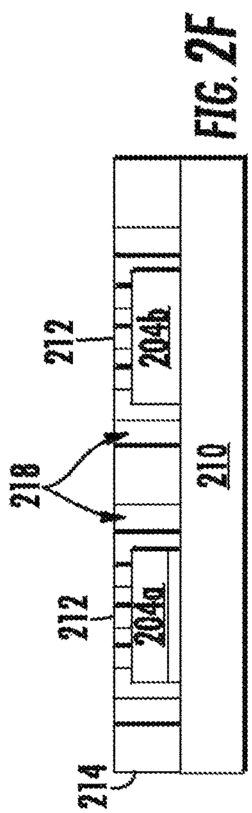
FIG. 2F
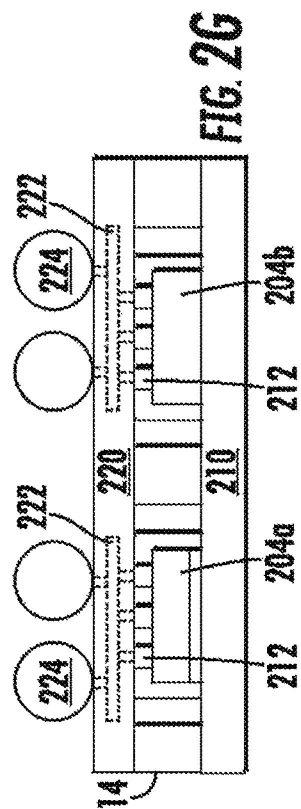
FIG. 2G
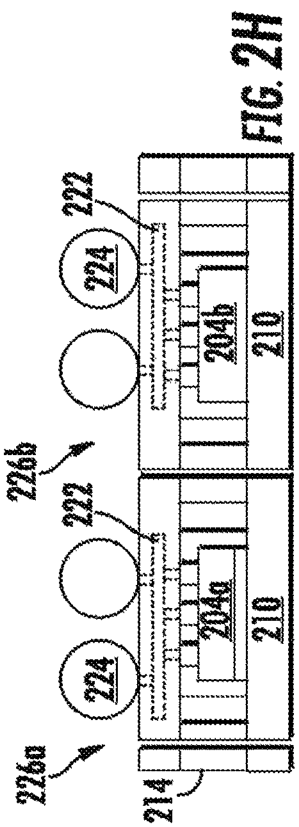
FIG. 2H
FIG. 2A
FIG. 2B
FIG. 2C
FIG. 2D

HERMETIC FLAT TOP INTEGRATED HEAT SPREADER (IHS)/ELECTROMAGNETIC INTERFERENCE (EMI) SHIELD PACKAGE AND METHOD OF MANUFACTURING THEREOF FOR REDUCING WARPAGE

RELATED APPLICATION

The present application claims priority to U.S. Provisional Application No. 62/631,134 filed Feb. 15, 2018, entitled "No TIM Hermetic Flat Top HIS/EMI Shield" which is incorporated herein by reference in its entirety.

FIELD OF THE INVENTION

The present disclosure relates to semiconductor packaging technologies.

BACKGROUND

Semiconductor devices are commonly found in modern electronic products.

Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation.

The terms "die", "semiconductor chip", and "semiconductor die" are used interchangeably throughout this specification. The term wafer is used herein include any structure having an exposed surface onto which a layer is deposited according to the present invention, for example, to form the circuit structure.

A "flip chip package" is a type of ball grid array (BGA) package that packages one or more integrated circuit dies. In a flip chip package, solder bumps are formed on the signal pads/terminals of a die, and the die is inverted ("flipped") and attached to the substrate of the package by reflowing the solder bumps so that they attach to corresponding pads on the surface of the substrate. This inverted orientation of the die on the substrate is referred to as a "flip chip" orientation.

FIG. 1 shows a cross-sectional side view of an example flip chip package 100. As shown in FIG. 1, flip chip package 100 includes an integrated heat spreader (IHS) lid 102, an integrated circuit die/chip 104, a thermal interface material 106, a carrier substrate 108, a plurality of solder bumps 110, and a lid adhesive 112. Die 104 includes an active region 114, which contains analog or digital circuits implemented as active devices, passive devices, conductive layers, and dielectric layers formed according to the electrical design of the die 104. Die 104 is mounted face down, with the active region 114 facing down towards the carrier substrate 108. As shown in FIG. 1, die 104 is mounted to carrier substrate 108 by solder bumps/balls 110. The IHS lid 102 is mounted to the carrier substrate 108 over the die 104. The adhesive 112 bonds a rim of the IHS lid 102 to the carrier substrate 108. The thermal interface material 106 is present on a top surface of the die 104 to provide for good heat conductance between the IHS lid 102 and the die 104. The carrier substrate 108 is electrically and mechanically connected to a printed circuit board (PCB) 114 with a BGA style second level packaging using conductive bumps 116. Semiconductor die 104 is electrically connected to PCB 114 through conductive bumps 110, signal lines 118, and conductive bumps 116.

Typically, IC packages are asymmetrical (in the direction perpendicular to the plane of the substrate) and are mechanically unbalanced. This asymmetry, along with the different materials used in the packaging (e.g., an organic package substrate, which has a different coefficient of thermal expansion (CTE) than the IC die), can cause both mechanical and thermal stresses, which in turn can lead to package warpage and co-planarity issues. Thus, it is known that wafer warpage continues to be a concern. Warpage can prevent successful assembly of a die-to-wafer stack because of the inability to maintain the coupling of the die and wafer. Warpage issue is serious especially in a large sized wafer and has raised an obstacle to a wafer level semiconductor packaging process that requires fine-pitch RDL process.

The present disclosure provides novel improved packaging methods resulting in reduced warpage or other defects.

BRIEF SUMMARY

According to some aspects of the present disclosure, methods of manufacturing a semiconductor device according to the present disclosure can include forming a semiconductor bonding surface on a first semiconductor substrate, wherein the first semiconductor substrate includes at least one integrated circuit region and includes an active surface opposite the semiconductor bonding surface. The method can further include bonding the semiconductor bonding surface of the first semiconductor substrate to a carrier bonding surface of a carrier substrate such that the semiconductor bonding surface is adjacent to, and in direct contact with, the carrier bonding surface. The method can also include encapsulating at least the first semiconductor substrate and at least a portion of the carrier bonding surface with an insulating encapsulation structure, then forming a metal-filled trench structure in the encapsulation structure between the carrier bonding surface and an upper surface of the encapsulation structure, with the upper surface of the encapsulation structure being distal from the carrier substrate. Finally, the method can include forming a redistribution layer (RDL) structure on the upper surface of the encapsulation structure, with the RDL structure including an interconnect structure that is electrically connected to the at least one integrated circuit region.

In some embodiments, the forming of the semiconductor bonding surface can comprise planarizing at least a portion of a surface of the first semiconductor substrate opposite the active surface.

In some embodiments, the forming of the semiconductor bonding surface can comprise forming a dielectric film on at least a portion of a surface of the first semiconductor substrate opposite the active surface and planarizing at least a portion of the dielectric film. In some such embodiments, the dielectric film can comprise silicon dioxide.

In some embodiments, the method can further include forming a plurality of conductive pillars on the active surface of the first semiconductor substrate and grinding the encapsulation structure until the conductive pillars are exposed.

In some embodiments, the forming of the metal-filled trench structure can comprise forming a trench in the upper surface of the encapsulation structure circumscribing the first semiconductor substrate and depositing a metal material in the trench to form a wall structure that circumscribes the first semiconductor substrate. In some such embodiments, the forming of the trench comprises using laser ablation to form the trench. Also, in some such embodiments, the depositing of the metal material in the trench includes depositing at least a portion of the metal material using at least one of chemical vapor deposition (CVD), physical vapor deposition (PVD), plasma-enhanced chemical vapor deposition (PECVD), and atomic layer deposition (ALD).

In some embodiments, the method can include planarizing a surface of the carrier substrate to form the carrier bonding surface before bonding the semiconductor bonding surface of the first semiconductor substrate to the carrier bonding surface of the carrier substrate.

According to other aspects of the present disclosure, methods of manufacturing a semiconductor device according to the present disclosure can include planarizing a first surface of a semiconductor substrate to form a semiconductor bonding surface, where the first semiconductor substrate includes an integrated circuit region and includes an active surface opposite the semiconductor bonding surface, and planarizing a surface of the carrier substrate to form a carrier bonding surface. The method also comprises bonding the semiconductor bonding surface to the carrier bonding surface, including positioning the semiconductor bonding surface directly adjacent to the carrier bonding surface. The method further comprises forming an encapsulation structure over the semiconductor substrate and at least a portion of the carrier bonding surface and forming a metal-filled trench structure in the encapsulation structure circumscribing the first semiconductor substrate. Finally, the method comprises forming a redistribution layer (RDL) structure over the encapsulation structure, the RDL structure including an interconnect structure that is electrically connected to the integrated circuit region.

In some embodiments, the method can further include forming a plurality of conductive pillars on the active surface of the first semiconductor substrate and grinding the encapsulation structure until the conductive pillars are exposed.

In some embodiments, the forming of the metal-filled trench structure can comprise forming a trench in the upper surface of the encapsulation structure circumscribing the first semiconductor substrate and depositing a metal material in the trench to form a wall structure that circumscribes the first semiconductor substrate. In some such embodiments, the forming of the trench comprises using laser ablation to form the trench, and the depositing of the metal material in the trench includes depositing at least a portion of the metal material using at least one of chemical vapor deposition (CVD), physical vapor deposition (PVD), plasma-enhanced chemical vapor deposition (PECVD), and atomic layer deposition (ALD).

In some embodiments, the carrier substrate can comprise a metal material type.

According to further aspects of the present disclosure, a semiconductor device comprises a carrier substrate having a carrier bonding surface, a semiconductor substrate having a semiconductor bonding surface, an active surface opposite the semiconductor bonding surface, and at least one integrated circuit region, wherein the semiconductor substrate is disposed on the carrier substrate with the semiconductor bonding surface being in contact with the carrier bonding surface without an adhesive therebetween, an encapsulant structure at least partially encapsulating the semiconductor substrate and at least a portion of the carrier bonding surface, a metal-filled trench structure extending between an upper surface of the encapsulation structure and the carrier substrate, the upper surface of the encapsulation structure being distal from the carrier substrate, and a redistribution layer (RDL) structure over the upper surface of the encapsulation structure, where the RDL structure including an interconnect structure that is electrically connected to the at least one integrated circuit region of the semiconductor substrate.

In some embodiments, the metal-filled trench structure can circumscribe the semiconductor substrate.

In some embodiments, the semiconductor bonding surface can be planarized and include a dielectric material.

In some embodiments, the semiconductor bonding surface can be planarized and lack a dielectric material.

In some embodiments, the semiconductor device can further comprise a plurality of conductive pillars extending from the active surface of the semiconductor substrate, where each of the plurality of conductive pillars is electrically connected to the at least one integrated circuit region and the interconnect structure of the RDL structure.

In some embodiments, the semiconductor device can further comprise at least one conductive bump on the RDL structure, the at least one conductive bump being electrically connected to the interconnect structure of the RDL structure.

BRIEF DESCRIPTION OF THE DRAWINGS

FIGS. 2A-2H show schematic, cross-sectional diagrams of an exemplary method for fabricating a wafer level package according to embodiments of the present disclosure.

DETAILED DESCRIPTION

Figure 1:
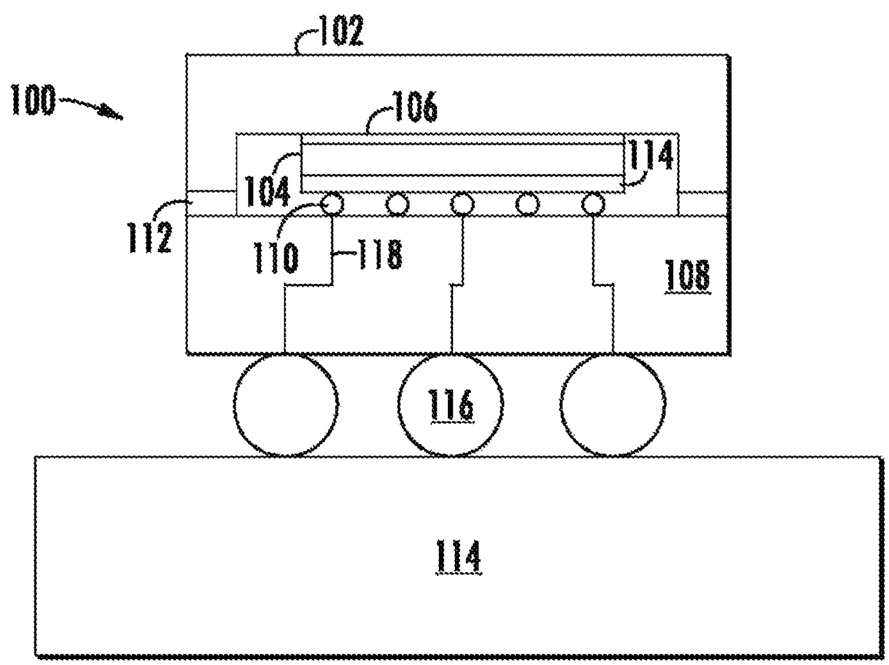
FIG. 1 shows a schematic, cross-sectional side view of an example of a flip chip package.

This disclosure relates to a wafer level packaging process. For example, in semiconductor wafer packaging processes, the wafer can be a semiconductor wafer or device wafer which has thousands of chips on it. Thin wafers, especially ultra-thin wafers (thickness less than 60 microns or even 30 microns) are very unstable, and more susceptible to heat damage than traditional thick wafers. For high power devices, or stringent temperature requirement devices, an Integrated Heat Spreader (IHS) has traditionally been used as a heat sink to help dissipate heat produced by the semiconductor device in operation. Installation of the IHS typically also required a thermal interface material (TIM) between the semiconductor die and IHS for good heat conductance. The TIM also needed to have some flexibility as a die-IHS mechanical buffer. In addition, use of the IHS required additional adhesive at the feet of the IHS to attach the IHS lid to the package substrate and also provide mechanical buffer.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

FIGS. 2A-2H show schematic, cross-sectional diagrams showing an exemplary method for fabricating a wafer level package according to the present disclosure.

As shown in FIG. 2A, a first semiconductor substrate 204*a*, a second semiconductor substrate 204*b*, and a carrier substrate 210 are prepared for assembly.

The first and second semiconductor substrates 204*a*, 204*b* can be, for example, semiconductor dies, for example, that have been diced from a silicon wafer, or a wafer of a different semiconductor, for example, germanium. The first and second semiconductor substrates 204*a*, 204*b* each includes a respective inactive surface 205*a*, a respective active surface 205*b*, and a respective integrated circuit region 205*c*. The integrated circuit region 205*c* can contain, for example, analog or digital circuits implemented as active devices, passive devices, conductive layers, and dielectric layers formed according to the electrical design of the respective semiconductor substrate 204*a*, 204*b*.

The carrier substrate 210 can be a metal substrate, for example formed of copper or other desired metal material. The carrier substrate 210 can alternately be a glass, ceramic, sapphire or quartz substrate.

Further, a bonding surface is formed on the carrier substrate 210 and on each of the semiconductor substrates 204*a*, 204*b*. More specifically, a semiconductor bonding surface 202 is formed on each of the semiconductor substrates 204*a*, 204*b*, and a carrier bonding surface 208 is formed on the carrier substrate 210. Formation of the semiconductor bonding surface 202 and the carrier bonding surface 208 includes planarizing the surfaces, for example by chemical mechanical polishing (CMP) or the like. In some embodiments, the planarizing of the semiconductor bonding surface 202 and the carrier bonding surface 208 results in a surface average roughness Ra of less than or equal to 20 Angstroms (Å), or more preferably less than or equal to 15 Angstroms (Å), or even more preferably less than or equal to 10 Angstroms (Å).

In some embodiments, the semiconductor bonding surface 202 can include the forming of a dielectric film 206 followed by the planarization described above. The dielectric film 206 can include a silicon oxide, a silicon oxynitride, a silicon nitride oxide, a silicon nitride, an aluminum oxide, or the like, and can be a single layer structure or a stacked-layer structure. In some such embodiments, the dielectric film 206 can have a thickness less than or equal to 20 nm, or more preferably less than or equal to 15 nm, or even more preferably less than or equal to 10 nm. The dielectric film 206 can be formed by a chemical vapor deposition (CVD) method.

Thus, in some embodiments, such as the embodiment of the semiconductor substrates 204*a* shown in FIG. 2A, the semiconductor bonding surface 202 can include a planarized dielectric film 206. However, in other embodiments, such as the embodiment of the semiconductor substrates 204*b* shown in FIG. 2A, the semiconductor bonding surface 202 can be a planarized surface of the semiconductor substrate 204*a* without a dielectric film.

Next, the semiconductor substrates 204*a*, 204*b* are flipped and then attached to the carrier substrate 210 so that the semiconductor bonding surfaces 202 face, adjoin, and directly contact the carrier bonding surface 208. Because the semiconductor bonding surfaces 202 and the carrier bonding surface 208 are planarized as described above, each of the semiconductor bonding surfaces 202 is bonded with the carrier bonding surface 208, whereby the semiconductor substrates 204*a*, 204*b* can be attached to the carrier substrate 210. In some embodiments, after the semiconductor substrates 204*a*, 204*b* are bonded to the carrier substrate 210, heat treatment in a temperature range of from 400° C. to 600° C. can be performed to further strengthen the bond.

The bonding between the semiconductor bonding surfaces 202 and the carrier bonding surface 208 is formed by van der Waals forces, so that a strong bond can be formed even at room temperature. Therefore, advantageously, no adhesive is needed to bond the semiconductor substrates 204*a*, 204*b* to the carrier substrate 210. Also, for embodiments such as semiconductor substrate 204*a* that include the optional dielectric film 206, the thin dielectric film 206 and the material of the semiconductor substrate 204*a*, for example silicone (Si), will form an additional covalence bond that can contribute to the overall bond between the semiconductor substrate 204*a* and the carrier substrate 210. Note that, since the above-described bonding can be formed at low temperature, various substrates can be used as the carrier substrate 210. For example, the carrier substrate 210 can be a metal substrate, for example formed of copper or other desired metal material. The carrier substrate 210 can alternately be a glass, ceramic, sapphire or quartz substrate.

Note that the dielectric film 206 is not necessarily formed on the semiconductor substrate 204*a*. In the case where the dielectric film 206 is not formed, such as with the semiconductor substrate 204, the carrier substrate 210 and the semiconductor substrate 204*b* can be bonded to each other. Note that by formation of the dielectric film 206 on the semiconductor substrate 204*a*, impurities such as an alkali metal or an alkaline-earth metal can be prevented from entering the semiconductor substrate 204*a* from the carrier substrate 210.

Turning next to FIG. 2B, the semiconductor substrates 204*a*, 204*b* are shown bonded to the carrier bonding surface 208 of the carrier substrate 210. After the bonding is completed, a plurality of conductive pillars 212 are formed on the active surfaces 205*a*. The conductive pillars 212 can be formed according to known processes for building up interconnect structures. For example, a patterning or photoresist layer can be formed over the active surfaces 205*a* of the semiconductor substrates 204*a*, 204*b*. A portion of the photoresist layer can then be removed by a photolithography and etching process, or LDA, to form openings extending to contact pads of the active surfaces 205*a*. An electrically conductive material can then be deposited into the openings of the photoresist layer using Cu plating, electrolytic plating, electroless plating, or other suitable metal deposition process to form conductive pillars 212. Then, remaining portions of the photoresist layer are stripped away leaving the conductive pillars 212. Conductive pillars 212 can have a cylindrical shape with a circular or oval cross-section, or conductive pillars 212 can have a cubic shape with a rectangular cross-section. Other pillar 212 cross-section shapes are used in other embodiments. In another embodiment, conductive pillars 212 can be 3-D metal posts formed by copper plating or copper stud bumps.

As shown in FIG. 2C, after the semiconductor substrates 204*a*, 204*b* are mounted on the carrier substrate 210 and the conductive pillars 212 are formed, an encapsulant is applied to form an encapsulation structure 214. The encapsulation structure 214 covers the attached semiconductor substrates 204*a*, 204*b* and at least a portion of the conductive pillars 212. The encapsulation structure 214 also at partially fill gaps between adjacent semiconductor substrates 204*a*, 204*b*. The encapsulation structure 214 can then be subjected to a curing process.

According to the illustrated embodiment, the encapsulation structure 214 can be formed using thermoset molding compounds in a transfer mold press, for example. Other means of dispensing the molding compound may be used. Epoxies, resins, and compounds that are liquid at elevated temperature or liquid at ambient temperatures may be used. The encapsulation structure 214 can be an electrical insulator and can be a thermal conductor. Different fillers may be added to enhance the thermal conduction, stiffness or adhesion properties of the encapsulation structure 214.

Next, as shown in FIG. 2D, the upper surface of the encapsulation structure 214 is exposed to a thinning process. In various embodiments, thinning may be performed mechanical and/or chemically. In one embodiment, the thinning process comprises a grinding process. The thinning process may be stopped after the conductive pillars 212 of the semiconductor substrates 204*a*, 204*b* are exposed or the thinning process is continued to reach to any desired thickness.

Turning to FIGS. 2E and 2F, a metal-filled trench structure 218 is formed next. The metal-filled trench structure 218 together with the metallic carrier substrate 210 forms a metal cage around a semiconductor substrate 204*a*, 204*b*. The metal-filled trench structure 218 acts as side walls of the metal cage, and the carrier substrate 210 acts as the lid of the cage. Since the semiconductor substrates 204*a*, 204*b* are in direct contact with the carrier substrate 210, the metal-filled trench structure 218 together with the metallic carrier substrate 210 can act as a heat sink for the semiconductor substrates 204*a*, 204*b*. Thus, the cage formation formed by the metal-filled trench structure 218 and the metallic carrier substrate 210 can eliminate the need for an integrated heat spreader (IHS). In some embodiments, the cage formation formed by the metal-filled trench structure 218 and the metallic carrier substrate 210 can also act as an Electro-Magnetic Interference (EMI) shield for the encaged semiconductor substrate 204*a*, 204*b*. Such an EMI shield is frequently placed over packages for cell phones, tablets, notebook computers, wireless routers, and other communication devices after the packages are surface mounted to a PCB (printed circuit board) for the device. However, the cage-like configuration of the metal-filled trench structure 218 and the metallic carrier substrate 210 advantageously can eliminate the need for a separate EMI shield.

Figure 3:
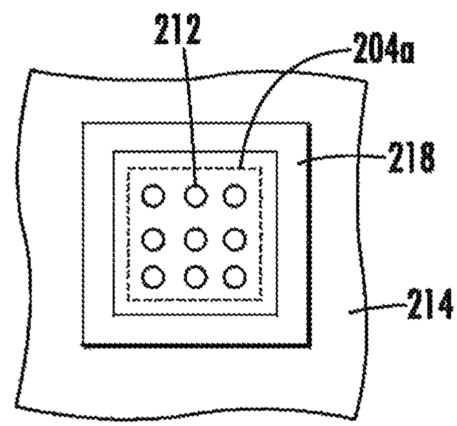
FIG. 3 shows a plan view of a portion of FIG. 2F of an embodiment of a metal-filled trench structure according to the present disclosure.

Referring also to FIG. 3, a plan view of a portion of FIG. 2F is shown that includes a plan view of an embodiment of the metal-filled trench structure 218. As shown in FIG. 3, in the illustrated embodiment the metal-filled trench structure 218 can be formed to circumscribe the semiconductor substrate 204*a*. Also, the metal-filled trench structure 218 is not in direct contact with the semiconductor substrate 204*a*. Instead, a gap is provided between the metal-filled trench structure 218 and the semiconductor substrate 204*a* and is filled with a portion of the encapsulation structure 214. Also, as shown in FIG. 2F, in some embodiments, the metal-filled trench structure 218 can extend from the carrier substrate 210, through the encapsulation structure 214, to above the semiconductor substrate 204*a*, for example to an upper surface of the encapsulation structure 214.

The metal-filled trench structure 218 can be formed by forming a trench 216 as shown in FIG. 2E, then filling the trench 216 to form the metal-filled trench structure 218 as shown in FIG. 2F.

Referring to FIG. 2E, etch processing is performed to selectively remove portions of the encapsulation structure 214 located between the carrier substrate 210 and the upper surface of the encapsulation structure 214. Any suitable etch process can be used, including but not limited to: dry etching "Bosch" style, steady state style, cryogenic silicon etch, laser ablation, particle blasting, wet etching, and micro electro discharge machining.

It will be appreciated that additional process steps not illustrated are known that can be used for filling the trench 216 with metal to complete the formation of the metal-filled trench structure 218. For example, a metal seed layer can be deposited into the trench 216. The metal seed layer in one embodiment can be a copper seed layer; in another embodiment the seed layer can be Tungsten or other suitable material. The seed layer can be formed using techniques such as CVD (Chemical Vapor Deposition), PVD (Physical Vapor Deposition), electro graphing, or plating on the barrier.

After the seed layer is deposited, a plating mask can be formed over the encapsulation structure 214 with portions of the plating mask in the trench 216 being removed to expose the seed layer in the trench 216. The plating mask can be patterned using either a negative or positive photo resist. It is believed that the negative photo resist material can be more completely removed from the via. Other surface plating inhibitors can be used as the plating mask. For example, stamped on material or sputtered layers such as Ti could be used. A plating process can then be performed to fill the trench 216 with solid metal to form the metal-filled trench structure 218, as shown in FIG. 2F. For example, a copper plating process can be performed to fill the trench 216. In one embodiment an electrochemical deposition (ECD) plating process is used. Other plating processes and materials could be used, such as chemical vapor deposition (CVD), physical vapor deposition (PVD), electroless (chemical or auto-catalytic), nano-particle or conductive polymers.

After the plating process, any plating mask can be removed and a planarizing process can be performed if desired, for example in some embodiments for removing a protected seed layer or plated metal that may be extending vertically above the encapsulation structure 214. For example, a chemical mechanical planarizing (CMP) operation can be performed that stops on the encapsulation structure 214.

As shown in FIG. 2G, subsequently, an electrically conductive layer or redistribution layer (RDL) structure 220 is formed over the encapsulation structure 214, wall structure 218, and conductive pillars 212. In some embodiments, the lower surface of the RDL structure 220 is in direct contact with the encapsulant structure 218. The RDL structure 220 can be formed using known RDL formation techniques. For example, the RDL structure 220 can be formed using a patterning and metal deposition process such as printing, PVD, CVD, sputtering, electrolytic plating, and electroless plating.

The RDL structure 220 is formed of dielectric material and includes one or more metallic interconnect structures 222 embedded in the dielectric material. However, the dielectric material exposes at least part of the metallic interconnect structures 222 for electrical connection purposes. The metallic interconnect structures 222 include one or more metallic layers and a plurality of via plug structures that provide for electrical connections through the RDL structure 220, for example between the semiconductor substrates 204*a*, 204*b* and conductive bumps 224. It should be noted that some metallic layers and via plug structures in the RDL structure 220 are omitted in the illustration presented in FIGS. 2G and 2H for simplicity. The metallic interconnect structures 222 can include one or more layers of Al, Cu, Sn, Ni, Au, Ag, or other suitable electrically conductive material.

As illustrated in FIG. 2G, the conductive pillars 212 are in contact with the RDL structure 220 and are attached to the metallic interconnect structures 222 in a flip-chip manner to electrically connect the semiconductor substrate 204*a*, 204*b* with the RDL structure 220. In other words, the active surface of each of the semiconductor substrates 204*a*, 204*b* is electrically connected to one or more of the metallic interconnect structures 222 of the RDL structure 220 through the conductive pillars 212.

As is also shown in FIG. 2G, a plurality of conductive bumps 224 are formed on the RDL structure 220. The conductive bumps 224 are electrically connected to the metallic interconnect structures 222 in the RDL structure 220. The conductive bumps 224 are also electrically connected to the active surfaces of the semiconductor substrates 204*a*, 204*b* through the metallic interconnect structures 222 and conductive pillars 212. In some embodiments, the conductive bumps 224 can comprise BGA balls and may be formed using, for example, a suitable ball drop process. In some embodiments, wherein the conductive bumps 224 comprise a solder material, a solder reflow process may be performed to reflow the solder material of the conductive bumps 224. In some embodiments, the conductive bumps 224 can be formed as micro-bumps or copper pillars.

As shown in FIG. 2H, the structure shown in FIG. 2G is singulated to form individual semiconductor devices 226*a*, 226*b*. In some embodiments, the structure of FIG. 2G can be singulated into the individual semiconductor devices 226*a*, 226*b* by sawing, laser ablation, or the like.

Figure 4:
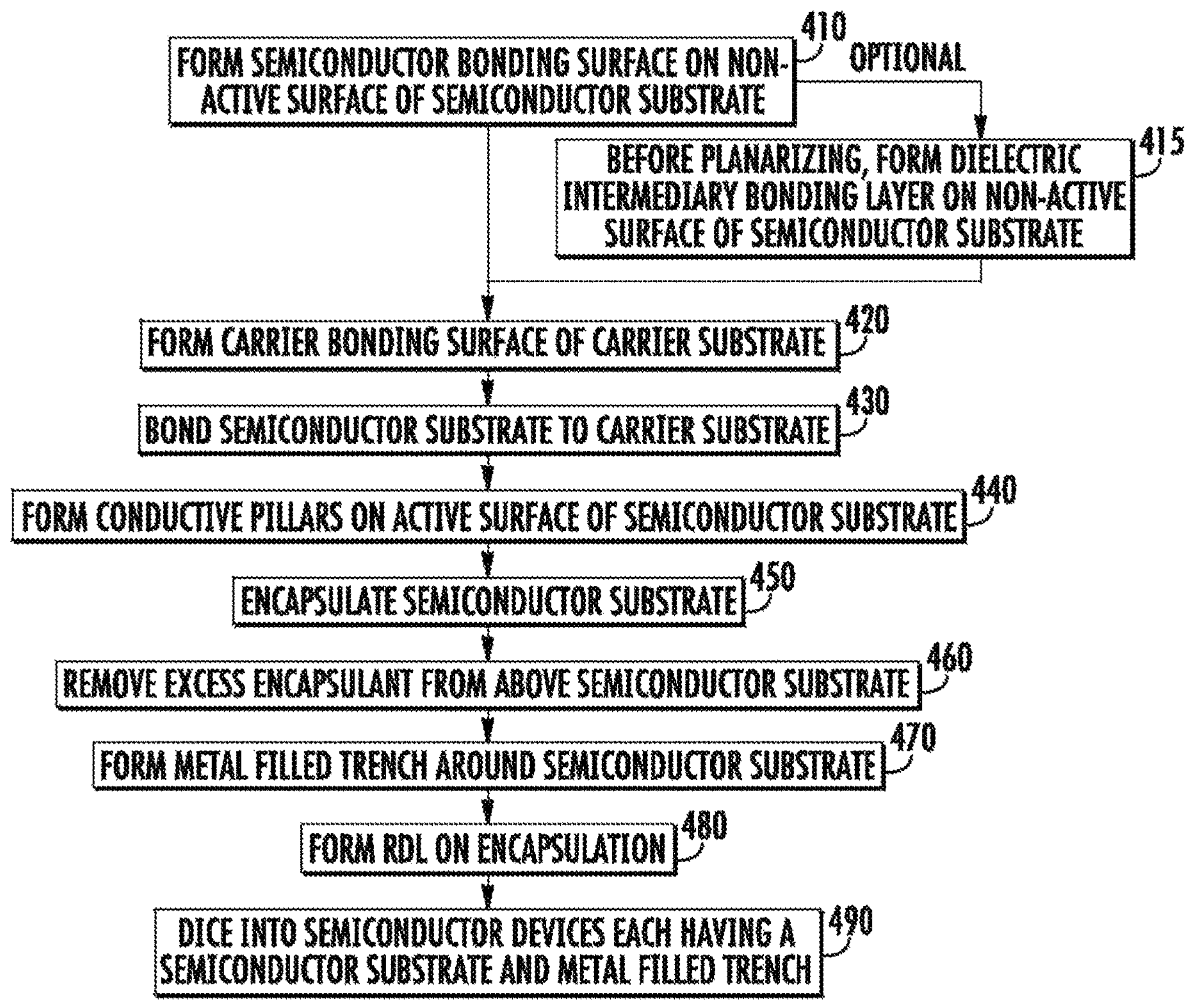
FIG. 4 is a process flow diagram showing an exemplary method for fabricating a wafer level package according to the present disclosure.

FIG. 4 is a process flow diagram 400 showing an exemplary method for fabricating a wafer level package according to the present disclosure. In this embodiment, the method of manufacturing a semiconductor device starts with a step 410 of forming a semiconductor bonding surface on a semiconductor substrate, where the semiconductor substrate can be, for example, a die having an integrated circuit region and an active surface opposite the semiconductor bonding surface. In some embodiments, this step can include planarizing a surface of a semiconductor substrate to form the semiconductor bonding surface. In some embodiments, the forming of the semiconductor bonding surface can include planarizing at least a portion of a surface of the first semiconductor substrate opposite the active surface. In some embodiments, as indicated at optional step 415, the forming of the semiconductor bonding surface can include forming a dielectric film on at least a portion of a surface of the first semiconductor substrate opposite the active surface and planarizing at least a portion of the dielectric film. In some such embodiments, the dielectric film can include silicon dioxide.

Next at step 420, the process includes forming a carrier bonding surface on a carrier substrate. In some embodiments, the carrier substrate can comprise a metal material type, for example copper. In some embodiments, the forming of the carrier bonding surface can include planarizing a surface of the carrier substrate to form the carrier bonding surface. Next, step 430 involves bonding the semiconductor substrate to the carrier substrate. In some embodiments, the semiconductor substrate can be placed on the carrier substrate and be bonded in place by a Van der Waals force, so no adhesive is needed to bond the semiconductor substrate to the carrier substrate.

Next, step 440 involves forming conductive pillars on the active surface of the semiconductor substrate. In some embodiments, one or more of the conductive pillars can be electrically connected to an integrated circuit region of a semiconductor substrate. Then step 450 involves encapsulating the semiconductor substrate and at least a portion of the carrier bonding surface with an insulating encapsulation structure. In some embodiments, this can include also encapsulating the conductive pillars. In some such embodiments, step 460 involves removing excess encapsulant, if any, from above semiconductor substrate, which can include grinding the encapsulation structure until at least a portion of the conductive pillars are exposed.

Next, step 470 involves forming a metal filled trench in the encapsulant structure around each semiconductor substrate. In some embodiments, this step can include forming the metal filled trench in the upper surface of the encapsulation structure circumscribing the first semiconductor substrate. In some embodiments, this forming of the trench can include using laser ablation to form the trench. In some embodiments, this step can further include depositing a metal material in the trench to form a wall structure that circumscribes the first semiconductor substrate. In some such embodiments, this can include depositing at least a portion of the metal material using at least one of chemical vapor deposition (CVD), physical vapor deposition (PVD), plasma-enhanced chemical vapor deposition (PECVD), and atomic layer deposition (ALD).

Next, step 480 involves forming a redistribution layer (RDL) structure on the encapsulation structure. In some embodiments, this can include forming an RDL structure on the upper surface of the encapsulation structure such that an interconnect structure of the RDL structure can be electrically connected to an integrated circuit region.

In some embodiments, the metal-filled trench structure formed at step 470 together with the metallic carrier substrate from step 420 forms a metal cage around a semiconductor substrate. The metal-filled trench structure can act as side walls of the metal cage, and the carrier substrate can act as the lid of the cage. Also, in some embodiments, the semiconductor substrates can be in direct contact with the carrier substrate, and in some such embodiments, the metal-filled trench structure together with the metallic carrier substrate can act as a heat sink for the semiconductor substrates. Thus, the cage formation formed by the metal-filled trench structure and the metallic carrier substrate can eliminate the need for an integrated heat spreader (IHS). In some embodiments, the cage formation formed by the metal-filled trench structure and the metallic carrier substrate can also act as an Electro-Magnetic Interference (EMI) shield for the encaged semiconductor substrate. Such an EMI shield is frequently placed over packages for cell phones, tablets, notebook computers, wireless routers, and other communication devices after the packages are surface mounted to a PCB (printed circuit board) for the device. However, the cage-like configuration of the metal-filled trench structure and the metallic carrier substrate advantageously can eliminate the need for a separate EMI shield.

Finally, step 490 involves dicing the structure from step 480 into individual semiconductor devices, each having a semiconductor substrate and a metal filled trench.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:

forming a semiconductor bonding surface on a semiconductor substrate, wherein the first semiconductor substrate includes at least one integrated circuit region formed on an active surface opposite the semiconductor bonding surface;

bonding the semiconductor bonding surface of the semiconductor substrate to a carrier bonding surface of a carrier substrate such that the semiconductor bonding surface is adjacent to, and in direct contact with, the carrier bonding surface of the carrier substrate;

encapsulating at least a portion of the semiconductor substrate and at least a portion of the carrier bonding surface with an insulating encapsulation structure;

forming a metal-filled trench structure in the insulating encapsulation structure between the carrier bonding surface and an upper surface of the insulating encapsulation structure, the upper surface of the encapsulation structure being distal from the carrier substrate, wherein the forming of the metal-filled trench structure comprises forming a trench in the upper surface of the insulating encapsulation structure circumscribing the semiconductor substrate, and depositing a metal material in the trench to form a wall structure that circumscribe the semiconductor substrate; and forming a redistribution layer (RDL) structure on the upper surface of the encapsulation structure, the RDL structure including an interconnect structure that is electrically connected to the at least one integrated circuit region.

2. The method of claim 1, wherein forming the semiconductor bonding surface on the semiconductor substrate comprises planarizing at least a portion of a surface of the semiconductor substrate opposite the active surface.

3. The method of claim 1, wherein forming the semiconductor bonding surface on the semiconductor substrate comprises forming a dielectric film on at least a portion of a surface of the semiconductor substrate opposite the active surface and planarizing at least a portion of the dielectric film.

4. The method of claim 3, wherein the dielectric film comprises silicon dioxide.

5. The method of claim 1, further comprising:

forming a plurality of conductive pillars on the active surface of the semiconductor substrate; and grinding the insulating encapsulation structure until at least a portion of the plurality of conductive pillars are exposed.

6. The method of claim 1, wherein forming the trench in the upper surface of the insulating encapsulation structure comprises using laser ablation to form the trench.

7. The method of claim 1, wherein depositing the metal material in the trench includes depositing at least a portion of the metal material using at least one of chemical vapor deposition (CVD), physical vapor deposition (PVD), plasma-enhanced chemical vapor deposition (PECVD), and atomic layer deposition (ALD).

8. The method of claim 1, further comprising planarizing a surface of the carrier substrate to form the carrier bonding surface before bonding the semiconductor bonding surface of the semiconductor substrate to the carrier bonding surface of the carrier substrate.

9. A method of manufacturing a semiconductor device, comprising:

planarizing a surface of a semiconductor substrate to form a semiconductor bonding surface, wherein the semiconductor substrate includes an integrated circuit region formed on an active surface opposite the semiconductor bonding surface;

planarizing a surface of a carrier substrate to form a carrier bonding surface;

bonding the semiconductor bonding surface to the carrier bonding surface, including positioning the semiconductor bonding surface directly adjacent to the carrier bonding surface;

forming an encapsulation structure over at least a portion of the semiconductor substrate and at least a portion of the carrier bonding surface;

forming a metal-filled trench structure in the encapsulation structure circumscribing the semiconductor substrate, wherein the forming of the metal-filled trench structure comprises forming a trench in an upper surface of the encapsulation structure circumscribing the semiconductor substrate, and depositing a metal material in the trench to form a wall structure that circumscribes the semiconductor substrate; and forming a redistribution layer (RDL) structure over the encapsulation structure, the RDL structure including an interconnect structure that is electrically connected to the integrated circuit region.

10. The method of claim 9, further comprising:

forming a plurality of conductive pillars on the active surface of the semiconductor substrate; and grinding the encapsulation structure until at least a portion of the plurality of conductive pillars are exposed.

11. The method of claim 9, wherein forming the trench comprises using laser ablation to form the trench, and wherein depositing the metal material in the trench includes depositing at least a portion of the metal material using at least one of chemical vapor deposition (CVD), physical vapor deposition (PVD), plasma-enhanced chemical vapor deposition (PECVD), and atomic layer deposition (ALD).

12. The method of claim 9, wherein the carrier substrate comprises a metal material type.

13. A semiconductor device, comprising:

a carrier substrate having a carrier bonding surface;

a semiconductor substrate having a semiconductor bonding surface, an active surface opposite the semiconductor bonding surface, and at least one integrated circuit region formed on the active surface, wherein the semiconductor substrate is disposed on the carrier substrate with the semiconductor bonding surface being in contact with the carrier bonding surface without an adhesive therebetween;

an encapsulant structure at least partially encapsulating at least a portion of the semiconductor substrate and at least a portion of the carrier bonding surface;

a metal-filled trench structure extending between an upper surface of the encapsulant structure and the carrier substrate, the upper surface of the encapsulant structure being distal from the carrier substrate, wherein the metal-filled trench structure comprises a trench in the upper surface of the encapsulant structure circumscribing the semiconductor substrate, and a metal material in the trench to form a wall structure that circumscribes the semiconductor substrate; and a redistribution layer (RDL) structure over the upper surface of the encapsulant structure, the RDL structure including an interconnect structure that is electrically connected to the at least one integrated circuit region of the semiconductor substrate.

14. The semiconductor device of claim 13, wherein the semiconductor bonding surface is planarized and includes a dielectric material.

15. The semiconductor device of claim 13, wherein the semiconductor bonding surface is planarized and lacks a dielectric material.

16. The semiconductor device of claim 13, further comprising a plurality of conductive pillars extending from the active surface of the semiconductor substrate, wherein each of the plurality of conductive pillars is electrically connected to the at least one integrated circuit region and the interconnect structure of the RDL structure.

17. The semiconductor device of claim 13, further comprising at least one conductive bump on the RDL structure, the at least one conductive bump being electrically connected to the interconnect structure of the RDL structure.

* * * * *